United States Patent [19]

Ammann et al.

[11] Patent Number: 5,206,820
[45] Date of Patent: Apr. 27, 1993

[54] METROLOGY SYSTEM FOR ANALYZING PANEL MISREGISTRATION IN A PANEL MANUFACTURING PROCESS AND PROVIDING APPROPRIATE INFORMATION FOR ADJUSTING PANEL MANUFACTURING PROCESSES

[75] Inventors: Hans H. Ammann, Chester; Kwokming J. Cheng, Lake Hiawatha; Richard F. Kovacs, Morris Plains, all of N.J.; Henry B. Micks, Jr., Richmond, Va.; Jamey Potechin, Oak Ridge; Everett Simons, Cedar Knolls, both of N.J.; Richard C. Steines, Richmond, Va.; John G. Tetz, Succasunna, N.J.

[73] Assignee: AT&T Bell Laboratories, Murray Hill, N.J.

[21] Appl. No.: 576,304

[22] Filed: Aug. 31, 1990

[51] Int. Cl.$^5$ .............................................. G01B 11/26
[52] U.S. Cl. ......................................... 364/559; 382/8
[58] Field of Search ............................ 364/559; 382/8

[56] References Cited

U.S. PATENT DOCUMENTS

| | | | |
|---|---|---|---|
| 3,955,072 | 5/1976 | Johannsmeier et al. | 364/559 X |
| 4,259,019 | 3/1981 | Johannsmeier et al. | 364/559 X |
| 4,536,239 | 8/1985 | Benson | 156/64 |
| 4,627,010 | 12/1986 | Kasugi | 364/559 |
| 4,697,087 | 9/1987 | Wu | 364/559 X |
| 4,712,016 | 12/1987 | Matsumura | 364/559 X |
| 4,713,784 | 12/1987 | Ayata | 364/559 |
| 4,719,357 | 1/1988 | Ayata et al. | 364/559 X |
| 4,774,640 | 9/1988 | Montean, Jr. | 362/89 |
| 4,793,052 | 12/1988 | Ammann et al. | 414/749 X |
| 4,805,123 | 2/1989 | Specht et al. | 364/559 |
| 4,894,606 | 1/1990 | Paur | 324/65 R |
| 4,918,380 | 4/1990 | Paur | 324/73.1 |

FOREIGN PATENT DOCUMENTS 3014629 10/1980 Fed. Rep. of Germany.

OTHER PUBLICATIONS

"Surface-Mounted Device Placement" IBM Technical Disclosure Bulletin; vol. 30, No. 1; Jun. 1987; pp. 228-334.

Primary Examiner—Edward R. Cosimano
Attorney, Agent, or Firm—A. G. Steinmetz

[57] ABSTRACT

A metrology system to analyze panel misregistration in a panel manufacturing process includes a software controlled system which checks defined panel parameters on the four corners of a panel and related artwork for processing with a master pattern etched on a glass reference with a machine vision measuring system. The panel or artwork being checked is positioned by panel center registration means to align the center of the panel with the center of the master pattern. Displacement and rotational differences are entered under software control into a data base and analyzed by a stored program intelligent analyses system into a plurality of parameters based on a parameter model which permits an analysis of the cause of the misregistration.

5 Claims, 9 Drawing Sheets

FIG. 1

ΔX: HORIZONTAL DISPLACEMENT

FIG. 2

ΔY: VERTICAL DISPLACEMENT

FIG. 3

θ: ROTATION

FIG. 4
α DISTORTION

FIG. 5
β DISTORTION

FIG. 6
$\gamma_{XY}$: SHEAR

FIG. 7

$\varepsilon_X$: X EXPANSION

FIG. 8

$\varepsilon_Y$: Y EXPANSION

METROLOGY SYSTEM FOR ANALYZING PANEL MISREGISTRATION IN A PANEL MANUFACTURING PROCESS AND PROVIDING APPROPRIATE INFORMATION FOR ADJUSTING PANEL MANUFACTURING PROCESSES

FIELD OF THE INVENTION

This invention relates to statistical process control of a panel or printed circuit board manufacturing process. It specifically relates to a metrology system for detecting and correcting process errors causing misregistration of panel components and features.

BACKGROUND OF THE INVENTION

The manufacture of printed circuit boards includes numerous sequential manufacturing steps in which the patterns of each successive manufacturing process must be congruent with the patterns produced by preceding processes. These successive manufacturing steps are normally all fairly complex in nature. They include pattern printing using a photographic mask, herein referred to as a phototool, and machining processes including drilling, routing, shearing, and sawing. The pattern and structure of the printed circuit board resulting from each step of these many sequential operations must be in accurate registration with patterns and structures generated in preceding process steps. This is particularly critical in multilayer boards where precise registration of the layers to each other is necessary to the proper electrical performance of the printed circuit board. A misregistration of a single operation could result in an electrical open or short circuit and nullify the correct work of all the other manufacturing steps.

Due to the trend to finer and finer grids and to closely spaced features, modern printed circuit boards require a very high degree of positional accuracy of imprinted features. Misregistration of pattern features on the panels may occur from misalignment of the panel and phototool or machine tool in any singular step of the manufacturing process. Another source of misregistration is deformation in the panel that may occur in one or more process steps or deformation in the phototools or machine tools used to process the panel. Temperature, humidity and repeated use alter the dimensions of the phototool, and wear and thermal stress may alter machine tool accuracy. In addition, the separate preprocessing of phototool and panels in different environments may introduce conflicting dimensional changes.

Due to the extreme importance of maintaining correct registration of all the features generated by the sequence of manufacturing steps throughout the entire sequence of the manufacturing operations, sampled product must be measured frequently during this process. Insufficient and infrequent inspection at various stages of manufacturing result in a very decreased yield of acceptable product. Overfrequent and excessive inspections may interrupt production unnecessarily and increase the cost of complex printed circuit boards beyond acceptable levels.

Conventional inspection techniques typically establish a sample size and measure the resulting features of the manufacturing process and identify those printed circuit boards that are acceptable and those which are not within tolerance within the lot sample. Frequent samples are necessary to identify quickly when the manufacturing process is out of control and limit the number of defective panels produced to a small number. Conventional frequent sampling is unfortunately costly and labour intensive. It typically does not indicate the aspect of the manufacturing sequence that has drifted out of control. Continued production of unacceptable product, therefore, is prevented by stopping the production process; but this method of statistical quality control is concerned with the quality of the printed circuit board and not the manufacturing process. It does not enhance or assist the identifying of the fault condition causing poor quality, or directly promote rapid continuance of the production process.

SUMMARY OF THE INVENTION

A metrology system to analyze panel misregistration in a printed circuit board or a panel manufacturing process includes a software controlled system which checks defined panel parameters. It uses machine vision measurements that are taken from the four corners of a panel or related phototools, relative to a master pattern etched on a glass reference. The panel or phototool being measured is positioned by a panel center registration means to align the center of the panel with the center of the master pattern. Measurements are entered under software control into a data base and analyzed by a stored program intelligent analysis system into a plurality of basic parameters based on a parameter model that categorizes misregistration into material changes and rigid motions. Further statistical refinement of categorized parameter data permits determination of the causes of the misregistration using both lot samples and long term trend analysis.

In a particular exemplary system, the detected corner offsets of the panel or phototool are measured and transformed into eight defined primary parameters. This step is performed on a sampling of panels or phototools selected from a manufacturing lot. The parameters obtained for the sample are converted to advanced parameters which reflect the physical causes of misregistration of panels in the lot. These advanced parameters are compared by the system to control limits calculated from the previous data, subject to certain over-riding limits. If desired, pre-selected limits may be specified and used. If these limits are exceeded, then the largest components of the advanced parameters are evaluated in light of the tooling and process history, including environmental changes and in-service time. The process system analyzes the collected basic parameter and advanced parameter data and lists probable causes of the detected misregistration. Also, extended period parameters are calculated for aggregates of several lot samples and used to identify long term trends in the manufacturing process causing misregistration.

A feature of this misregistration detection arrangement is that all the misregistration information necessary for controlling the panel or phototool processing is obtained by measuring the displacement of x-y fiducials (i.e. standard marks placed on the panel or phototool) at the four corners of the panel or phototool. The fiducials are placed at a maximum distance from the center of the panel (i.e., at the corners of the panel). This maximizes the signal-to-noise ratio of the measurement system, since the measurement noise is a fixed quantity and the measurement signal (i.e. the amount of misregistration) is maximum at the panel corners.

DETAILED DESCRIPTION

The manufacture of printed circuit boards or panels with superimposed patterns involves a large number of sequential operations in which a plurality of patterns and tools must be maintained in registration with each other during the manufacturing process from start to finish. During this manufacturing process, various machine tools, phototools and panels must be repeatedly brought into registration with each other. This registration must be repeatedly validated and corrections to the process made when misregistrations of patterns and/or panels occur.

For a manufacturing process to maintain a desired registration accuracy, it must depend on accurate inspection to detect misregistration, followed by the proper corrective action to the manufacturing process. This requires a precise understanding as to the probable causes of the misregistrations occurring. Basic to acquiring this understanding is knowledge of how the panel being processed and the related machine tools and phototools are superimposed during processing and how misalignment and dimensional changes contribute to misregistrations.

Panels, for example, experience dimensional changes due to temperature and/or humidity. Relative dimensional changes between panels and phototool cause misregistration. Errors in setup of tools and machines represent another cause of misregistration. Wear of tools and processing machines over extended periods of time may affect registration. The combined effect of many simultaneously occurring errors masks the individual causes. By defining the misregistration in terms of a physically significant model, the measurements of fiducial displacements may be transformed into parameters which may be manipulated to pinpoint the causes of the misregistration.

Primary parameters of misregistration are graphically depicted in the FIGS. 1–8 which illustrate the various primary categories, established according to the invention, within the eight-parameter model or framework used in the illustrative process monitoring and control system. The eight-parameter model of misregistration is descriptive of how well the patterns on a panel or phototool are registered and is amenable to determining the causes of misregistration. (Patterns on a panel may include drilled holes, copper features or solder mask features, while patterns on a phototool are the opaque features imprinted on the phototool.) The eight parameters are divided, according to the invention, into two primary classes; rigid body displacements and material deformation dimensional changes.

Figure 1:
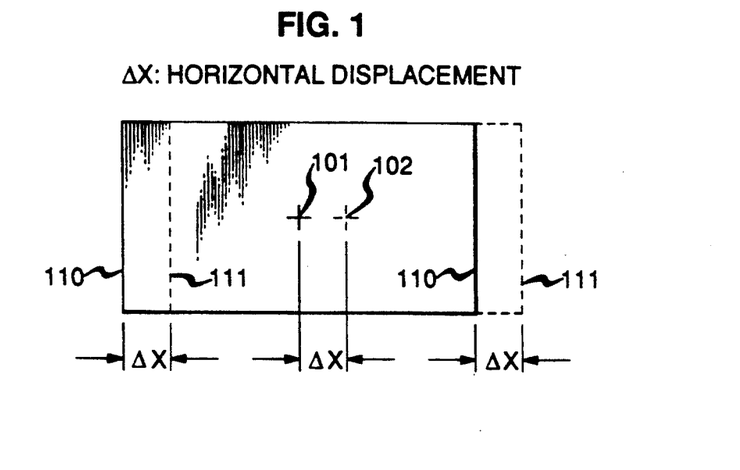
FIGS. 1–8 disclose schematically various panel misalignments and deformations that occur and which may adversely affect registration during panel processing.
Figure 2:
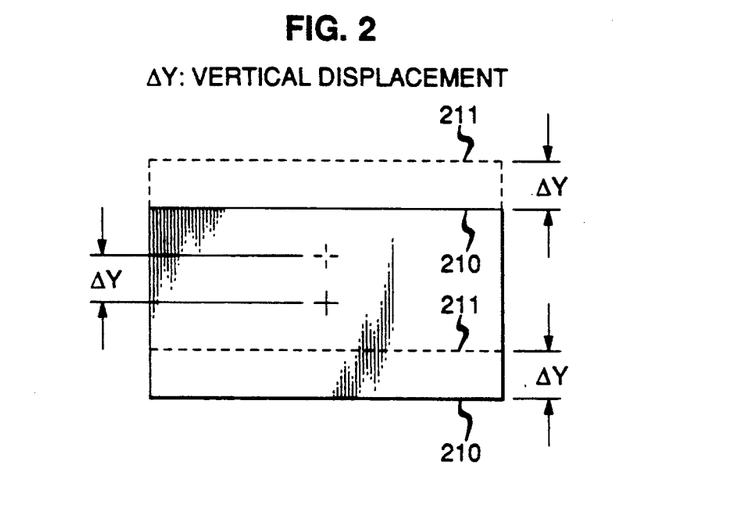

The rigid body displacements are directional shifts and include the x-shift, y-shirt and rotation. A change in a horizontal location x or x-shirt (designated $\Delta X$) is shown in FIG. 1. The central origin 101 of the pattern is displaced $\Delta X$ to point 102. Solid line 110 represents the correct alignment and dotted line 111 represents the displaced pattern object. A vertical location change $\Delta Y$ or y-shift is shown in FIG. 2. Her the actual pattern 211 is displaced from the solid line reference boundary 210 by $\Delta Y$. Both $\Delta X$ and $\Delta Y$ are independent of one another to the extent that a change in one location x or y is not a direct influence on the change in location along the axes y or x, respectively. The pattern and reference center points are shifted away from one another but the shape and area of the pattern remains unaltered.

Figure 3:
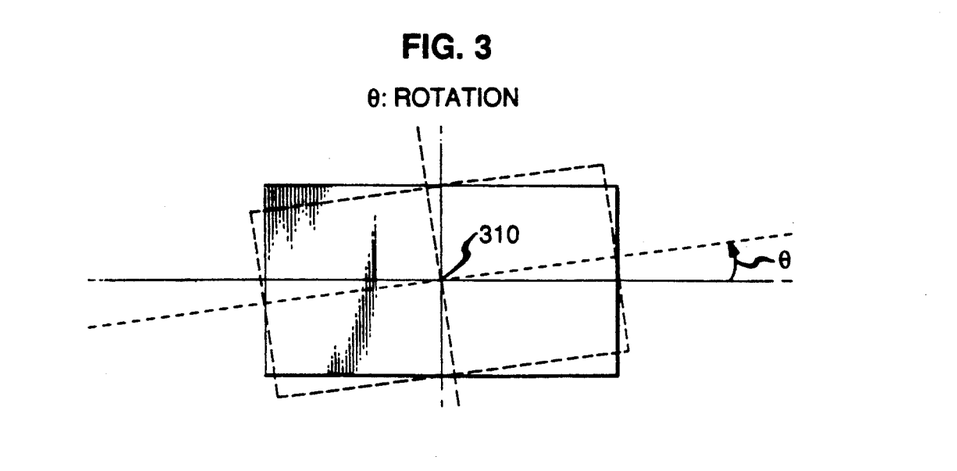

The third rigid body parameter is shown in FIG. 3. It involves a simple angular change (rotation) $\Theta$ of the pattern. If rotation alone occurs, the centers 310 of the pattern and reference are not affected and remain concordant with one another. Rotation often occurs in conjunction with x- and y-shifts.

Figure 4:
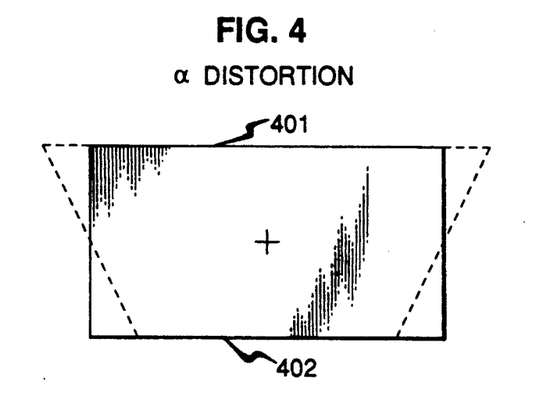
Figure 5:
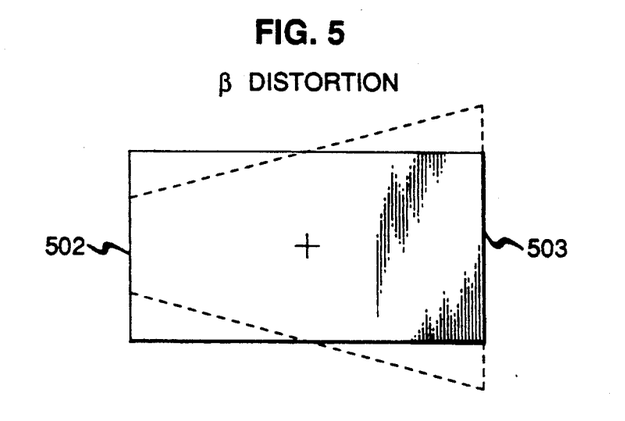

Deformation parameters are related to changes in the shape and form dimensions of the pattern. Two deformation parameters, shown in FIGS. 4 and 5, are designated as the alpha ($\alpha$) and beta ($\beta$) parameters. Each of these parameters involves a stretch and contraction along the same axis of the pattern but displaced to opposing sides of the pattern as shown in FIGS. 4 and 5. In the alpha distortion, shown in FIG. 4, the top edge 401 has been stretched while the lower edge 402 has shrunk. In the beta distortion of FIG. 5, the left edge 502 has shrunk and the right edge 503 has expanded.

Figure 6:
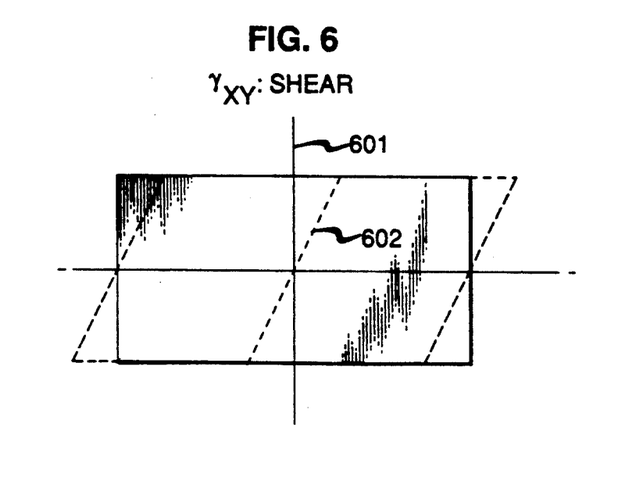

Shear, another deformation parameter shown in FIG. 6, involves a skewing of the vertical axis to the position of axis 602. It is symbolically designated $\gamma XY$ and it results in a deformation of the pattern that causes its shape to depart from a right angled parallelogram.

Figure 7:
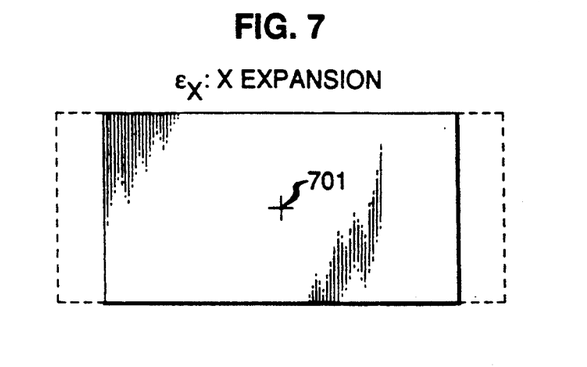
Figure 8:
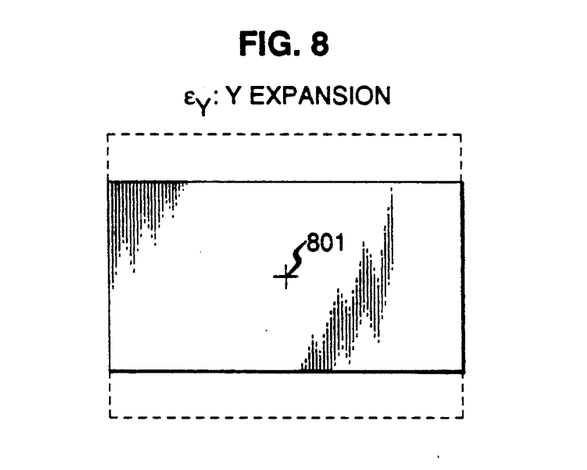

FIGS. 7 and 8 disclose dimensional changes in the pattern along the x- and y-axis in which the respective pattern and reference centers 701 and 801 are not shifted relative to each other. These changes in dimension are designated $\epsilon_X$ and $\epsilon_Y$ and are normally uniform over the entire pattern. They may be due to temperature and humidity changes or other causes that cause corresponding changes along the x- and y-axis.

Figure 9:
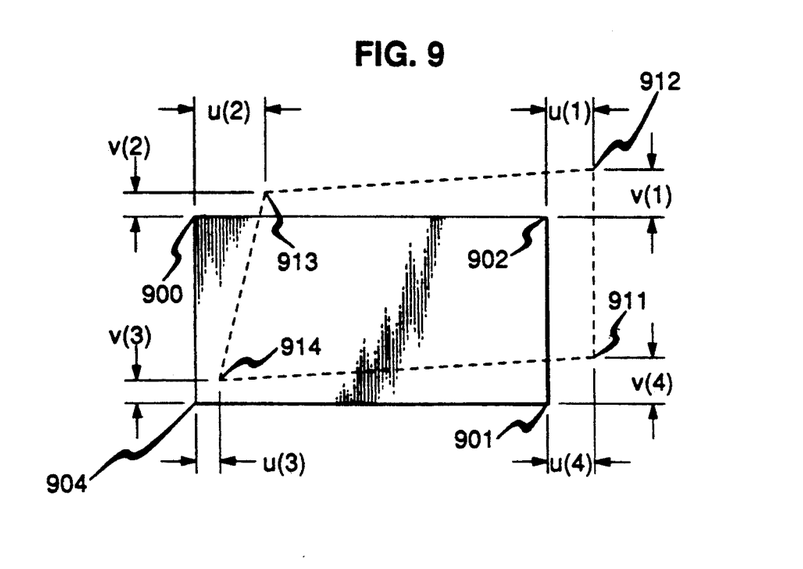
FIG. 9 is a schematic of a typical pattern of misregistration.

These eight primary parameters have been derived from a dimensional analysis of the various changes which may occur to the panel and related phototools and machine tools during various stages of the process. A typical deformation of a panel, for example, is shown in FIG. 9 in terms of change in the coordinate location of its corners 901–904 to the points 911–914. Each corner shift can be defined with a horizontal shift U and a vertical shift V. According to the eight-parameter model, these basic dimensional changes U and V can be defined by a polynomial series from which it is derived.

Figure 10:
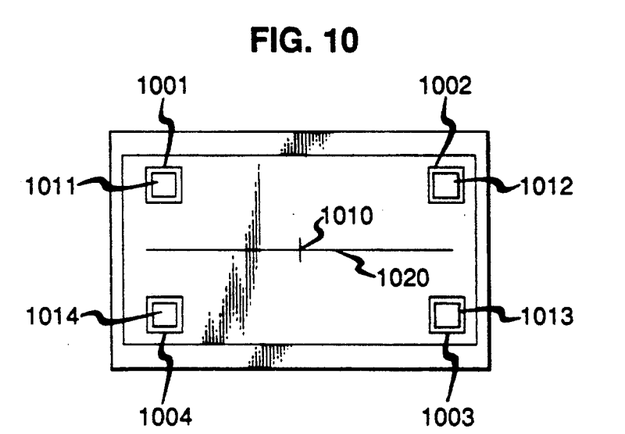
FIG. 10 is a schematic of illustrative fiducials added to a reference device, the phototool and the panels to facilitate measurement of misregistration.

One particular pattern of fiducials used in the illustrative embodiment is shown in FIG. 10 and is discussed below. Given the U and V displacements of the four measured fiducials, the eight parameters are solved from a polynomial series. Two polynomial series are used to express each U and V displacement in terms of four coefficient values which are selected to describe how one pattern is registered to another in terms that are physically significant. Any displacements between corresponding points on two superimposed patterns are related to combinations of rigid body translations and rotations and to specific types of material deformations of the patterns.

The horizontal displacement U depends on the four values $$U = a_0 + a_1 x + a_2 y + a_3 xy \quad (1)$$

The displacement V depends on the four values $$V = b_0 + b_1 x + b_2 y + b_3 xy \quad (2)$$

The parameters are related to the coefficient terms of the formulas (1) and (2) as follows:

| Parameter | ab formula |
|---|---|
| $\Delta X$, x-Shift | $a_0$ |
| $\Delta Y$, y-Shift | $b_0$ |
| $\theta$, Rotation | $b_1$ |
| $\gamma_{XY}$, Shear | $b_1 + a_2$ |
| $\epsilon_X$, X Expansion | $a_1$ |
| $\epsilon_Y$, Y Expansion | $b_2$ |
| $\alpha$, Alpha | $a_3$ |
| $\beta$, Beta | $b_3$ |

Occurrences of misregistrations, in the illustrative embodiment, are detected by the displacements of four fiducials relative to a standard of reference. In the illustrative embodiment the reference fiducials are engraved on a reference glass plate. A schematic of the fiducials used in the illustrative embodiment is shown in FIG. 10 and comprises the four square markers or reference fiducials 1001-1004 engraved on the reference glass 1000. The rectangular boxes 1011-1014 overlaid thereon represent the fiducials that are on the phototool or other item and are being compared to the reference fiducials.

The center coordinate point 1010 of the reference is the master reference frame point from which the horizontal and vertical displacements are respectively measured. The reference center 1010 is selected as the controlling reference point in the embodiment herein because it is easy to align with and permits a more uniformly accurate registration over the extend of the panel. Apparatus for aligning panels and phototool to a common center 1010 and a common axis 1020 reference has been disclosed in my prior U.S. Pat. No. 4,793,052 issued Dec. 27, 1988 which discloses a method for positioning a panel and its phototool. Positioning apparatus engages tooling features (i.e., holes) in the panel to align and secure one panel to a machine reference. The method disclosed therein uses one major axis and a reference origin which is at the panel center. Displacements occurring in panel features are in general smaller than for other positioning systems that use other reference origins because a center origin minimizes the maximum registration error caused by various deformations. Another advantage of this method is the virtual elimination of positioning backlash which detracts from many mechanical positioning schemes. This elimination of backlash in the positioning significantly enhances the performance of the metrology system disclosed herein.

Figure 11:
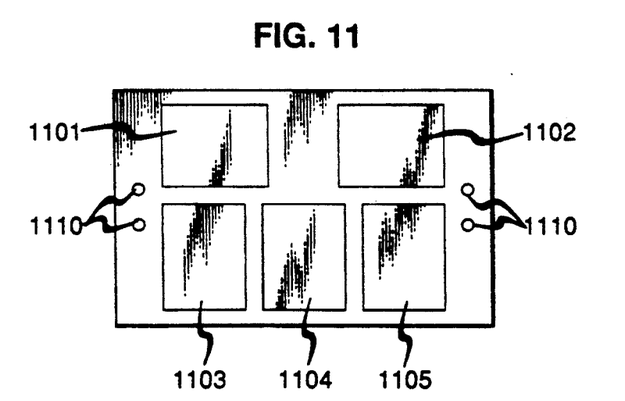
FIG. 11 is a schematic of a panel or phototool layout and of tooling features included to facilitate positioning of these items for measurement and processing.

A typical panel layout for processing, as shown in FIG. 11, may include a plurality of individual printed circuit board layouts 1101-1105 on the panel. These five printed circuit board layouts are positioned as shown on the panel. Tooling features comprising the paired holes 1110 at opposite edges of the panel allow its positioning for processing, as per the methods disclosed in the U.S. Pat. No. 4,793,052 patent which is included herein by reference. The metrology system, according to the invention, initially measures the offset of phototool or panel fiducials from reference fiducials. These offsets are converted to parameters of a model of the deformation and rigid position displacements of a single panel. By further converting these offset measurements into a set of advanced parameters, the physical causes of misregistration are identified. Long term trends are identified by analysis of these advanced parameters for aggregates of several lot samples.

Figure 12:
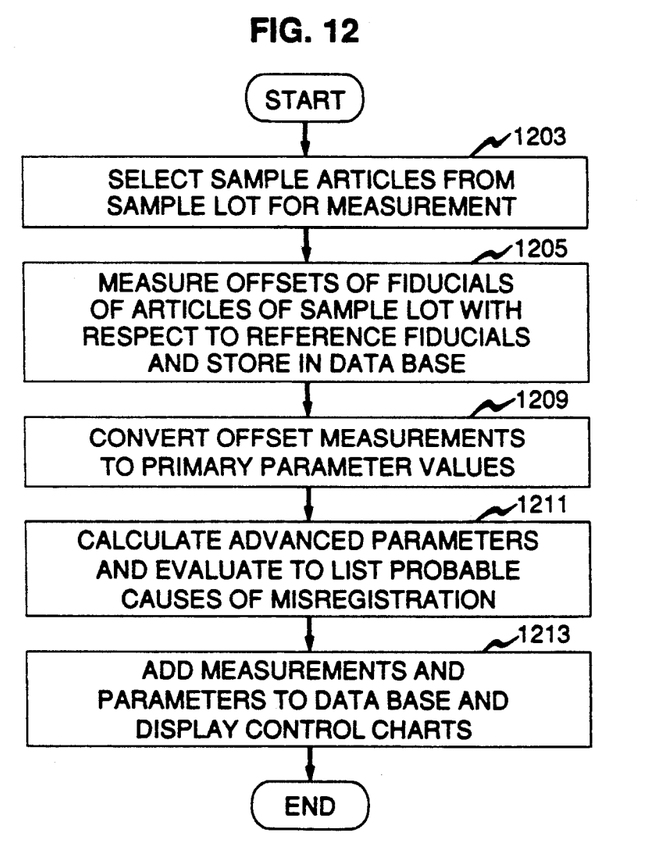
FIG. 12 discloses a flowchart of the overall process control used to monitor registration in a panel processing system.
Figure 16:
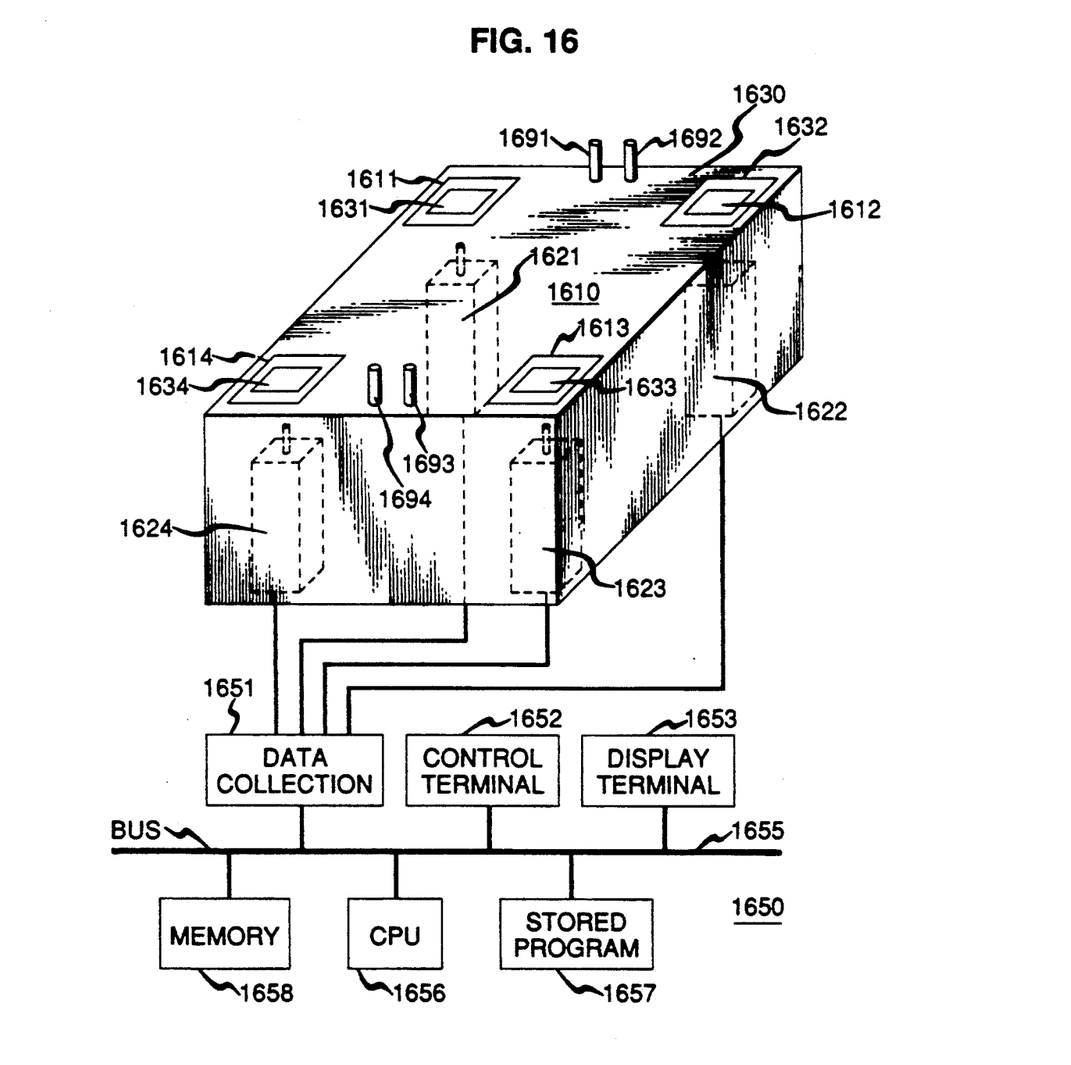
FIG. 16 is a schematic of processing tools and supporting equipment used in the registration measurement and analysis process control.

The flow diagram of this metrology process is shown in FIG. 12. This may be implemented in a stored program controlled system such as shown in FIG. 16. A lot sample is defined for testing per the instructions of block 1203. The measurement process begins in block 1205 by comparing the registration of the fiducials in the corners of the panel phototool or tool with the absolute reference fiducials. The U and V fiducial offsets in each of the four corners are measured and recorded in a data base, as per the instructions of block 1205. In the illustration this data base is stored in a data processing computing device. These measurements are repeatedly performed until the entire lot sample has been measured as determined by the decision block 1205.

These U and V measurements are converted by the instructions of block 1209 to the eight-parameter model defined by equations (1) and (2) above. The values $a_n$ and $b_n$ are obtained by solving equations (1) and (2). These eight values define the primary parameters of the metrology model as listed above. These primary parameter values are transformed into advanced parameters by the instructions of block 1211. The processes of block 1211, in performing this transformation, are disclosed in detail in the flowchart of FIGS. 13 and 14, and discussed herein below. The various measurements and calculated parameters are used to generate tables and control charts for trend evaluation as per the instructions of block 1213.

Figure 13:
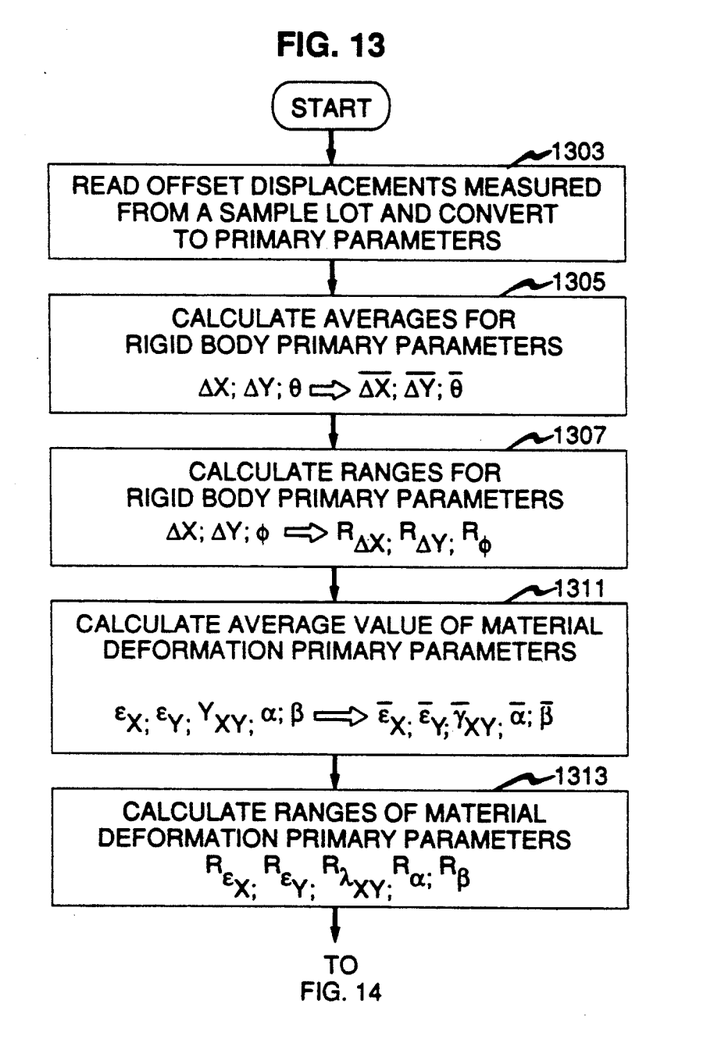
FIGS. 13 and 14 disclose a flowchart of a process to identify probably causes of detected misregistration.
Figure 14:
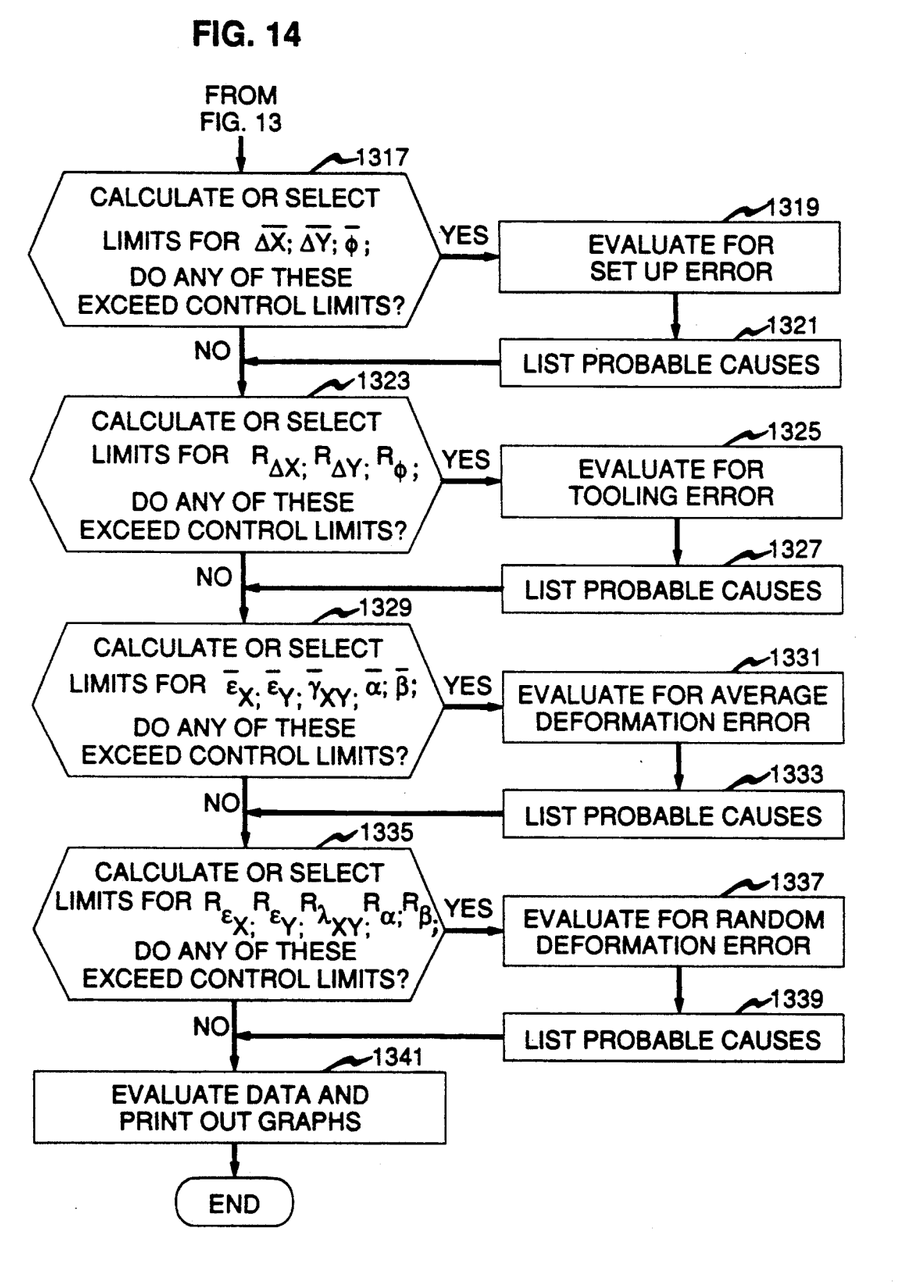

The flow process for deriving the advanced parameters and analyzing the causes of detected misregistrations is disclosed in the flowcharts of FIGS. 13 and 14. Initially the offset measurements ar read from a data base and converted to the primary parameters by the instructions of block 1303. These primary parameter values are used, per the instructions of block 1305, to derive the averages of $\Delta X$, $\Delta Y$ and $\Theta$ which represent the rigid body translations. These averages are designated $\overline{\Delta X}$, $\overline{\Delta Y}$ and $\overline{\Theta}$.

The range and standard deviation are different but statistically proportional measures of the variability within a set of data. Choosing whether to use the standard deviation of the range depends upon the physical requirements of the production process and the level of training of the process operators. The lot range (maximum minus minimum within a lot) is typically used on operator-level control charts. The standard deviation is used for long term trend analysis, which will be described later.

The lot ranges are calculated from the measurements as per the instructions of block 1307. These values are designated $R_{\Delta X}$, $R_{\Delta Y}$, and $R_\Theta$.

These calculated advanced parameters are now evaluated to determine if unacceptable misregistrations exist and to indicate the probably causes of such misregistrations. Once $\{\overline{\Delta X}, \overline{\Delta Y}, \overline{\Theta}\}$ and $\{R_{\Delta X}, R_{\Delta Y}, R_\Theta\}$ have all been caclulated, their values are automatically compared to statistically determined thresholds called "control limits." All six of these values are automatically displayed to the operators, along with their control limits; values outside these limits are automatically flagged as "bad".

Advanced parameters computed from the material deformation primary parameters ($\epsilon_X$, $\epsilon_{XY}$, $\alpha$, $\beta$) are calculated by determining the average values of $\overline{\epsilon_X}$ $\overline{\epsilon_Y}$ $\overline{\gamma_{XY}}$, $\overline{\alpha}$ and $\overline{\beta}$ respectively. The advanced parameters $R_{\epsilon_X}$, $R_{\epsilon_Y}$, $R_{\gamma_{XY}}$, $R_{60}$ and $R_\beta$, the lot ranges of the primary patterns, are then calculated as per the instructions of the block 1313.

The decision process of block 1317 investigates if the average values of $\overline{\Delta X}$, $\overline{\Delta Y}$ and $\overline{\Theta}$ exceed control limits; these limits may be selected or calculated from prior data with a no answer the flow process proceeds to the decision block 1323. If these control limits are exceeded, an unacceptable registration condition has been detected. Setup error, representing repeatable hardware and/or procedural problems, is investigated as a probable cause according to the instructions of block 1319. This probable cause is listed, as per the instructions of block 1321, and corrective action concerning procedures and hardware corrections is suggested. In photoprint operations, for example, one possible cause of setup error would be inaccurate tooling holes in the phototool; this contribution can be accurately determined by (re)measuring the phototool.

The process flow proceeds to the decision of block 1323 which determines if the lot ranges $R_{\Delta X}$, $R_{\Delta Y}$ and $R_\Theta$ exceed the control limits; these limits may be selected or calculated from prior data. With a no answer the flow process proceeds to the decision block 1329. If these control limits are exceeded, the flow proceeds to block 1325 whose instructions evaluate the data for probably tooling error. Its causes may be incorrect installation and/or slack in the panel or phototool positioning apparatus. These items are then subjected to mechanical inspection by personnel, as per the probable causes listed, in response to the instructions of the block 1327.

The calculated advanced parameters are evaluated to determine if unacceptable conditions of material deformations exist and to indicate the probable causes of such deformations. Once $\{\overline{\epsilon_X}, \overline{\epsilon_Y}, \overline{\gamma_{XY}}, \overline{\alpha}, \overline{\beta}\}$ and $\{R_{\epsilon_X}, R_{\epsilon_Y}, R_{\gamma_{XY}}, R_{60}$ and $R_\beta\}$ have all been calculated, their values are automatically compared to statistically determined thresholds, as described below. Values outside these limits are automatically displayed.

Process flow proceeds to the decision block 1329 to determine if any of the advanced parameter values representing average material deformations ($\{\epsilon_X, \epsilon_Y, \gamma_{XY}, \alpha, \beta\}$) exceed their control limits which may be calculated or pre-selected. With a no answer the flow process proceeds to the decision block 1335. If these limits are exceeded, the flow proceeds to the instructions of the block 1331 to evaluate for average deformation error. Causes include non-standard environmental conditions of the phototool, panel product or processing machine(s). These probable causes are listed as per the instructions of block 1332 and the flow proceeds to the decision block 1335 which compares the lot ranges $\{\epsilon_X, \epsilon_Y, \gamma_{XY}, \alpha, \beta\}$ with their calculated or pre-established control limits. With a no answer the flow process proceeds to the instruction block 1341. If these control limits are exceeded, the instructions of the block 1337 evaluate the causes for random deformation error, such rapidly changing environmental conditions (e.g. temperature and humidity) during the panel processing procedure. The flow process proceeds to the block 1339 which lists probable causes for the misregistration and then to the block 1341 whose instructions call for a print out of graphs for evaluation of the data. The flow process terminates at the END terminal.

Long term trend analysis is based on collected data for a plurality of lot samples. Long term trend analysis allows evaluation and fine-tuning of all the registration processes; it is performed according to the flow process disclosed in FIG. 15. Using data from many lots enhances the statistical accuracy of the diagnostics, and facilitates identification of gradual variations and small but statistically significant biases.

Figure 15:
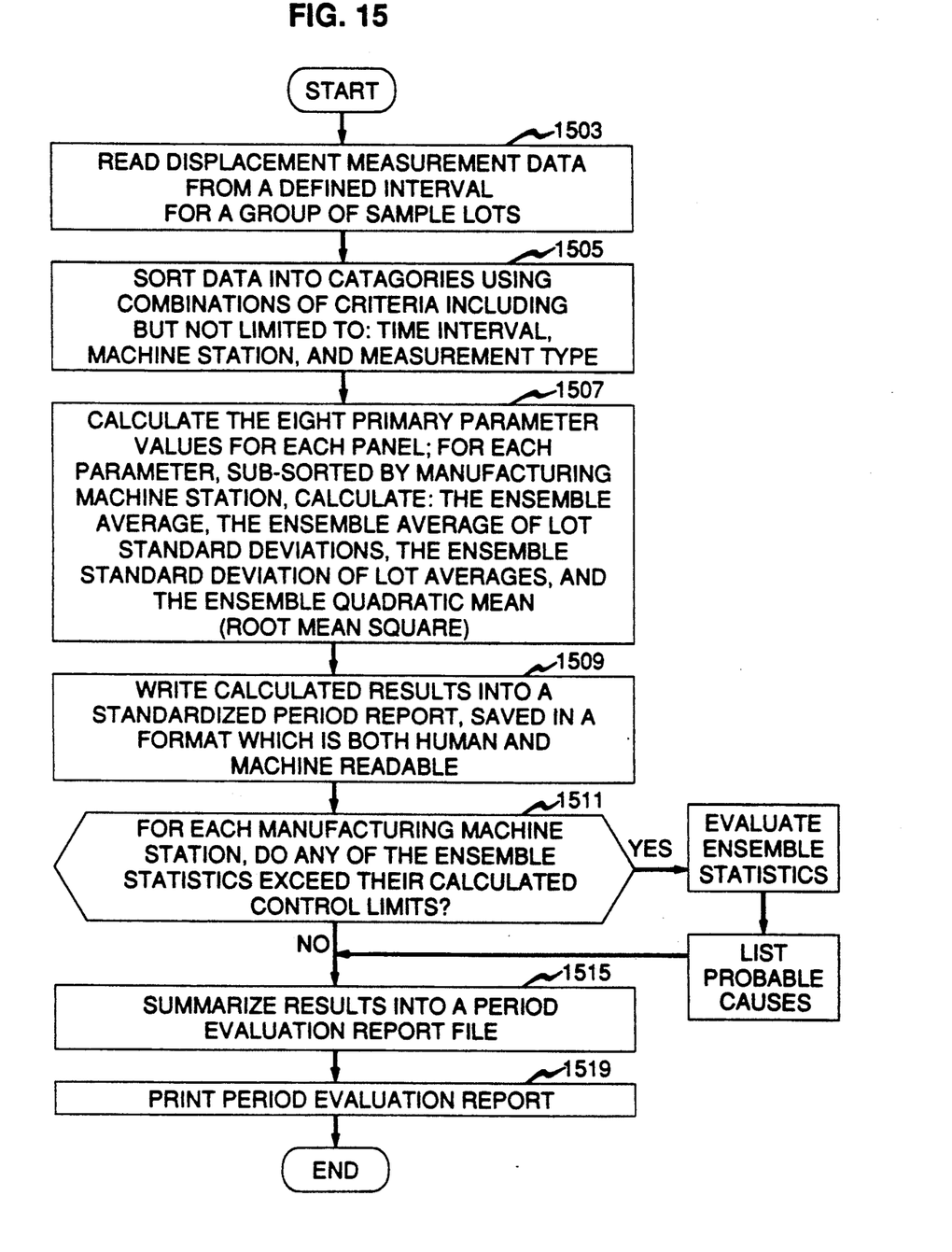
FIG. 15 is a flowchart for performing periodic trend analysis of the panel manufacturing process to identify the probably causes of misregistration.

Displacement measurements stored from a plurality of lot samples is accumulated according to the instructions of the block 1503. If desired, the data can be sorted to select or eliminate lots according to desired combinations of various criteria, e.g. product family (Double-Sided vs Multilayer) using the menu-driven instructions of block 1505. Extended period parameters are calculated for the accumulated data as per the instructions of block 1507. These values fall into three basic types for each of the eight primary parameters, e.g. $\Delta X$. Ensemble averages, e.g. $\overline{\Delta X}$, show any long term average bias. Ensemble standard deviations of lot averages, e.g. $\sigma_{\overline{\Delta X}}$, represent the standard deviations of averages within a lot, and show any long term variability between lots. Ensemble averages of lot standard deviations, e.g. $\overline{\sigma_{\Delta X}}$, show the average variability within lots, averaged over many lots. The calculated results are saved in a file, both human and machine readable, by the instructions in block 1509.

The eight primary parameters calculated in block 1507 are written into a standardized report in block 1509. These parameters are compared to control limits by the process of decision block 1511. If any of these limits are exceeded, the flow process proceeds to block 1521 which evaluates the ensemble statistics and the instructions of the next block 1523 directs the probably causes of displacement errors to be listed. If the response of the decision block 1511 is a no answer, the flow process proceeds directly to the block 1515 whose instructions summarize results of the flow process. The ensemble averages for the rigid body parameters $\{\overline{\Delta X}, \overline{\Delta Y}, \overline{\Theta}\}$ (e.g. $\overline{\Delta X}$), and their ensemble averages of lot standard deviations (e.g. $\sigma_{\Delta X}$) have causes including but not limited to those listed by blocks 1321 and 1327 respectively. The ensemble averages for the material deformations $\{\epsilon_X, \epsilon_Y, \gamma_{XY}, \alpha, \beta\}$ (e.g. $\overline{\epsilon_X}$) and their ensemble averages of lot standard deviations (e.g. $\sigma_{\epsilon_X}$) have causes including but not limited to those listed by blocks 1333 and 1339 respectively. Results of the long term trend analysis are recorded and summarized, as per block 1515, and displayed as per block 1519.

A measurement system suitable for use in the described metrology system described herein is shown schematically in FIG. 16. A transparent reference plate 1610 with reference fiducials 1611–1614 in the four corners is mounted above four video cameras 1621-1624 with the fiducials in their field of vision. The pattern 1630 includes its own complementary fiducials 1631-1634 located in its corners. The fiducials 1631-1634 are measured with respect to the fiducials 1611-1614 of the reference plate to determine the U and V displacements. For measurement one pattern 1630 is overlaid on top of the reference plate 1610 and positioned by application of the method disclosed in the aforementioned U.S. Pat. No. 4,793,052. Engaging elements 1691-1694 controlled by a mechanism such as disclosed in the (052) patent engage holes punched or drilled in the pattern and postion it so that its center and an axis through that center is congruent with a center of the reference plate and an axis passing through that center. Details of the positioning mechanism and the operation there of may be obtained from the (052) patent whose teaching and disclosure is incorporated herein by reference.

The displacements of the pattern fiducials from the reference fiducials are measured by a computer control system 1650 from the video images produced by the camera 1621-1624. The computer control system 1650 includes input means 1651 for collecting the measured fiducial displacements and a control terminal 1652 for accepting operator input. A display terminal 1653 is included for displaying basic measurements, calculated results and graphical depiction thereof. A bus 1655 interconnects these units to each other and to a processor 1656, a stored program unit 1657 and a memory unit 1658.

We claim:

1. Apparatus for inspecting pattern registration in a panel manufacturing process, comprising:
    a panel locating mechanism using panel centered positioning techniques;
    a pattern marking corners of the patterns with working fiducials symmetric about a center of the pattern;
    a transparent reference surface with reference fiducials marked on the surface and positioned symmetric about a center of the reference surface;
    superimposing a pattern, with corners of the pattern marked with working fiducials symmetric about a center of the pattern, on the reference surface using the panel locating mechanism for positioning the pattern on the reference surface;
    a machine vision measurement apparatus positioned for measuring displacements of the working fiducials from the reference fiducials;
    a computer system coupled to receive the measured displacements from the machine vision measurement apparatus and including memory for storing the measured displacements in a data base, and including an output display apparatus for displaying results of the inspecting of pattern registration;
    wherein the improvement comprises:
    the computer system including a stored program control including instructions for decomposing the measured displacements stored in the data base into a set of rigid body transition parameters and material deformation transition parameters;
    the stored program control of the computer system including further instructions for transforming the rigid body parameters and material deformation parameters, associated with a plurality of patterns of a sample lot being analyzed, into a set of multiple composite distortion parameters related to a plurality of patterns, including average values and deviation values of the rigid body parameters and average values and deviation values of the material deformation parameters;
    the computer system including memory including stored numerical control limits for each of the multiple composite distortion parameters;
    the stored program control including further instruction for comparing each of the multiple composite distortion parameters with the numerical control limits;
    the stored program control including instructions for assigning causes of misregistration to specific operations and conditions of the panel manufacturing process by assigning a probably cause associated with each of the multiple composite distortion parameters that exceed the critical threshold limits; and
    the output display apparatus communicating the the results of inspecting pattern registration and displaying any pattern misregistrations and displaying the causes assigned for these misregistrations to operative personal.

2. Apparatus for inspecting pattern registration as claimed in claim 1;
    the improvement further comprising:
    the stored program being operative for decomposing the measured displacements into rigid body and deformation parameters by solving polynomial expansion series equations.

3. Apparatus for inspecting pattern registration as claimed in claim 2;
    the improvement further comprising:
    memory for storing measured displacements from data of an aggregate of sample lots; and the stored program control being operative for converting the measured displacements from data of an aggregate of sample lots into extended period parameters for analyzing trends of registration in the panel manufacturing process.

4. A panel inspection and measurement system, comprising;
    A panel measurement apparatus, including:
    a transparent reference surface with reference fiducials inscribed therein and having a reference center and a reference axis with respect to the reference fiducials;
    positioning apparatus for locating the panel with a pattern including pattern fiducials dimensionally related to the reference fiducials and to a pattern center and pattern axis of the panel so that registration of the reference fiducials and pattern fiducials is related to registration of the reference center and reference axis to the pattern center and pattern axis;
    a vision type measuring system for measuring displacements of the pattern fiducials from the reference fiducials;
    means for collecting data and output means for displaying data on the displacements measured;
    wherein the improvement comprises:
    means for displacement cause evaluation, including a data storage means, a data processor means and a memory means including a stored program for evaluating the displacements in terms of causes of the displacements, and an output means including;
    means for transforming the displacements measured into a first set of primary parameters restructuring the displacements into rigid body displacements and material deformed displacements, means for transforming the parameters into a second set of advanced parameters related to displacements of the pattern center and pattern axis of the panel from registration with the reference pattern and reference axis surface; and means for analyzing the individual terms of the advanced parameters to generate further output on the output means and printing out a graph to suggest probable causes of the misregistration.

5. In a panel inspection and measurement system in which panels are analyzed for misregistration a method of determining causes of the misregistration, comprising the steps of:

including pattern fiducials as part of a overall pattern on a panel and the panel having an axis and center locus about which the overall pattern and pattern fiducials are referenced;

placing the panel having the pattern fiducials on a transparent reference surface having corresponding reference fiducials and an axis and center about which the reference fiducials are referenced;

positioning the panel on the transparent reference surface by engaging tooling features of the panel with a locating system associated with the transparent reference surface and operative to align the axis and center of the panel with the axis and center of the transparent reference surface;

measuring displacements of the pattern fiducials from the reference fiducials by vision measuring techniques;

collecting data on displacements measured;

displaying the data on displacements measured;

storing the displacement measurements in a data storage system;

wherein the improvement comprises the steps of:

transforming the displacement measurements into a first set of primary parameters restructuring the displacements into rigid body displacements and material deformed displacements, transforming the parameters into a second set of advanced parameters related to displacements of the pattern center and pattern axis of the panel from registration with the reference pattern and reference axis surface;

analyzing the individual terms of the advanced parameters to generate an output to suggest probable causes of the misregistration; and displaying and printing out a graph representing the probable causes as a part of a readout of the displacement measurements.

* * * * *